United States Patent [19]
Kawakubo et al.

[11] Patent Number: 5,889,696
[45] Date of Patent: Mar. 30, 1999

[54] THIN-FILM CAPACITOR DEVICE AND RAM DEVICE USING FERROELECTRIC FILM

[75] Inventors: Takashi Kawakubo, Yokohama; Noburu Fukushima, Tokyo; Kazuhide Abe, Kawasaki, all of Japan

[73] Assignee: Kabushiki Kaisha Toshiba, Kawasaki, Japan

[21] Appl. No.: 45,958

[22] Filed: Mar. 23, 1998

[30] Foreign Application Priority Data

Mar. 27, 1997 [JP] Japan ................................. 9-076315

[51] Int. Cl.$^6$ ................................................ G11C 11/22
[52] U.S. Cl. ............................................ 365/145; 365/149
[58] Field of Search ................................ 365/145, 149

[56] References Cited

U.S. PATENT DOCUMENTS

| 5,666,305 | 9/1997 | Mihara et al. | 365/145 |
| 5,796,648 | 8/1998 | Kawakubo et al. | 365/145 |

OTHER PUBLICATIONS

K. Torii et al., "Dielectric Properties of RF–Magnetron–Sputtered (Ba,Pb) (Zr,Ti) O$_3$ Thin Films", Jpn. J. App; Phys. vol. 31 Part1, No. 9B, pp. 2989–2991 (1992).

H. Itoh et al., Japan Ceramics Society, 10th Electronics Materials Division Seminar (1992)—in Japanese.

*Primary Examiner*—David Nelms
*Assistant Examiner*—Trong Phan
*Attorney, Agent, or Firm*—Finnegan, Henderson, Farabow, Garrett & Dunner, L.L.P.

[57] ABSTRACT

A semiconductor memory device is constituted by arranging a plurality of memory cells in a matrix format, each of which includes a thin-film capacitor having a ferroelectric film and a pair of electrodes facing each other via the ferroelectric film, and a transfer gate transistor connected to the thin film capacitor. A voltage corresponding to the width of a hysteresis curve obtained when the thin-film capacitor is saturated and polarized falls within the range of 5% or higher to 20% or lower of the voltage difference between the positive and negative directions in a writing operation. A remanent polarization amount obtained when the thin-film capacitor is saturated and polarized falls within the range of 5% or higher to 30% or lower of the total polarization amount obtained upon application of a voltage in the writing operation.

20 Claims, 8 Drawing Sheets

THIN-FILM CAPACITOR DEVICE AND RAM DEVICE USING FERROELECTRIC FILM

BACKGROUND OF THE INVENTION

The present invention relates to a thin-film capacitor device and a RAM device which use a ferroelectric film consisting of, e.g., a ferroelectric material having a perovskite crystal structure.

Recently, memory devices (ferroelectric memories) using a thin ferroelectric film as a storage medium have been developed, and some have already been used in practical applications. The ferroelectric memory is nonvolatile and does not lose its memory contents after the power supply is turned off. When the film is sufficiently thin, spontaneous polarization can be quickly inverted to enable high-speed writes and reads, like the DRAM. Further, a large capacity is also attained because a 1-bit memory cell can be constituted by one transistor and one ferroelectric capacitor.

A thin ferroelectric film suitable for the ferroelectric memory is required to have large remanent polarization, low temperature dependency of remanent polarization, a long holding time (retention) of remanent polarization, and the like.

At present, as a ferroelectric material, lead zirconate titanate (PZT) is mainly used. PZT is a solid solution of lead zirconate and lead titanate. PZT having a molar ratio of almost 1:1 is considered to be excellent as a storage medium because its spontaneous polarization is large to allow reversal even with a low electric field. Since the transition temperature (Curie temperature) of PZT between the ferroelectric phase and the paraelectric phase is as relatively high as 300° C. or higher, the polarization are hardly lost by heat within the use temperature range (120° C. or lower) of a normal electronic circuit.

However, a high-quality thin PZT film is difficult to fabricate due to the following reason. First, since lead as the main component of PZT easily evaporates at 500° C. or higher, the composition is difficult to accurately control in sputtering and subsequent annealing. Second, PZT exhibits ferroelectricity only when it forms a perovskite crystal structure. PZT having this perovskite crystal structure is rarely obtained, and a crystal structure called pyrochlore is easily obtained. When PZT is applied to a silicon device, lead as the main component is difficult to be prevented from diffusing into silicon, and is easily reduced in a reduction atmosphere in the device process to lose the ferroelectricity.

Barium titanate ($BaTiO_3$) is known as a typical ferroelectric, other than PZT. Barium titanate also has a perovskite crystal, like PZT, and its Curie temperature is about 120° C., as is known well. Since Ba rarely evaporates as compared to Pb, the composition is relatively easily controlled in forming a thin barium titanate film. When barium titanate crystallizes, most crystal structures are of the perovskite type.

Regardless of these advantages, a barium titanate thin-film capacitor is hardly examined as the storage medium of the ferroelectric memory because the remanent polarization of barium titanate is smaller than that of PZT, and the temperature dependency of its remanent polarization is high. This is because the Curie temperature of barium titanate is low (120° C.). When a ferroelectric memory is formed using barium titanate, its memory contents may be lost during use at a high temperature of 100° C. or higher. In addition, the temperature dependency of remanent polarization is high even in the normal use temperature range (85° C. or lower) of an electronic circuit, and the operation is unstable. Therefore, a thin-film capacitor using a thin ferroelectric film of barium titanate is considered to be unsuitable as the storage medium of the ferroelectric memory.

BRIEF SUMMARY OF THE INVENTION

The present inventors have found that a new thin ferroelectric film can be obtained by employing the following material and film formation method. More specifically, a ferroelectric material (e.g., $Ba_xSr_{1-x}TiO_3$; to be referred to as BST hereinafter) having a lattice constant relatively near and slightly larger than that of a lower electrode (e.g., a (100) plane of Pt) is selected. Epitaxial growth is caused in the c-axis direction as the polarization axis by employing a film formation method called RF magnetron sputtering in which misfit dislocations are rarely generated during film formation. In this case, even in a thin film having a relatively large thickness of 200 nm or more, the lattice constant in the direction of thickness (c-axis direction) can become larger, while keeping the lattice constant in the in-plane direction (a-axis direction) smaller, as compared with the original lattice constant of the dielectric, due to the epitaxial effect. The present inventors confirmed that there could be realized a thin ferroelectric film in which the ferroelectric Curie temperature was shifted to the high-temperature side, large remanent polarization was obtained within the room temperature range, and sufficiently large remanent polarization could be held even if the temperature was increased to about 85° C.

Such a thin ferroelectric film can be fabricated by using, as a lower electrode, strontium ruthenate ($SrRuO_3$ having a lattice constant a of 0.393 nm; to be referred to as SRO hereinafter), and using, as a dielectric, barium strontium titanate ($Ba_xSr_{1-x}TiO_3$; to be referred to as BST hereinafter) having a composition range of "x=0.30 to 0.90". In this case, realization of the following ferroelectric characteristics suitable for practical applications was experimentally confirmed. That is, ferroelectricity was exhibited even in a composition range ($x \leq 0.7$) in which it should not be originally exhibited at room temperature, and the Curie temperature originally higher than room temperature further increased in a composition range ($x > 0.7$) in which the ferroelectricity was originally exhibited.

Formation of a ferroelectric memory (to be referred to as FRAM hereinafter) and a dynamic random access memory (to be referred to as DRAM hereinafter) using an epitaxial dielectric film has been proposed. The FRAM adopts a thin film having a composition which maximizes remanent polarization based on ferroelectric characteristics. The DRAM employs a thin film having a composition which maximizes the dielectric constant, i.e., a composition with a Curie temperature around room temperature.

It is an object of the present invention to provide a thin-film capacitor device and a RAM device capable of higher integration, which employ a thin ferroelectric film exhibiting ferroelectric characteristics by means of the epitaxial effect.

According to a first aspect of the present invention, there is provided a thin-film capacitor device using a ferroelectric film, comprising:

a thin-film capacitor having a ferroelectric film and a pair of electrodes facing each other via the ferroelectric film; and control means for applying an operating voltage to the thin-film capacitor, wherein a voltage corresponding to a width of a polarization hysteresis curve measured upon application of maximum operating voltages in positive and negative directions to the thin-film capacitor falls within a range of not less than 5% to not more than 20% of a difference between the maximum operating voltages in the positive and negative directions.

According to a second aspect of the present invention, there is provided a thin-film capacitor device using a ferroelectric film, comprising:

a thin-film capacitor having a ferroelectric film and a pair of electrodes facing each other via the ferroelectric film; and control means for applying an operating voltage to the thin-film capacitor, wherein a remanent polarization amount measured upon application of maximum operating voltages in positive and negative directions to the thin-film capacitor falls within a range of not less than 5% to not more than 30% of a total polarization amount measured upon application of the maximum operating voltages in the positive and negative directions.

According to a third aspect of the present invention, there is provided a RAM device using a ferroelectric film, comprising:

a plurality of memory cells arranged in a matrix format, each memory cell having a thin-film capacitor having a ferroelectric film and a pair of electrodes facing each other via the ferroelectric film, and a transfer gate transistor connected to the thin-film capacitor; and control means for driving the transistor and applying an operating voltage to the thin-film capacitor, wherein a voltage corresponding to a width of a polarization hysteresis curve measured upon application of maximum operating voltages in positive and negative directions to the thin-film capacitor falls within a range of not less than 5% to not more than 20% of a difference between the maximum operating voltages in the positive and negative directions.

According to a fourth aspect of the present invention, there is provided a RAM device using a ferroelectric film, comprising:

a plurality of memory cells arranged in a matrix format, each memory cell having a thin-film capacitor having a ferroelectric film and a pair of electrodes facing each other via the ferroelectric film, and a transfer gate transistor connected to the thin-film capacitor; and control means for driving the transistor and applying an operating voltage to the thin-film capacitor, wherein a remanent polarization amount measured upon application of maximum operating voltages in positive and negative directions to the thin-film capacitor falls within a range of not less than 5% to not more than 30% of a total polarization amount measured upon application of the maximum operating voltages in the positive and negative directions.

In any one of the first to fourth aspects, preferable manners are as follows:

One of the pair of electrodes provides an underlayer surface oriented in one direction, and the ferroelectric film is made of a single-crystal grown on the underlayer surface, or a polycrystal grown on the underlayer surface to be oriented in one direction between the pair of electrodes.

The underlayer surface has a lattice constant smaller than a lattice constant of a material of the ferroelectric film, and the crystal of the ferroelectric film deforms under an influence of the underlayer surface to decrease a lattice constant in a direction parallel to the underlayer surface and increase the lattice constant in a film thickness direction.

The material of the ferroelectric film is given by a composition expression of $Ba_x\alpha_{1-x}Ti_y\beta_{1-y}O_3$ ($0<x\leq1$, $0<y\leq1$), where $\alpha$ is at least one material selected from the group consisting of Sr and Ca, and $\beta$ is at least one material selected from the group consisting of Sn, Zr, Hf, Mg, Ta, Nb, and Zn.

A lattice constant of the crystal of the ferroelectric film in a c-axis direction extending in the film thickness direction is 0.405 to 0.420 nm.

The control means applies the operating voltage to set an effective relative dielectric constant corresponding to a charge storage amount per applied voltage for the thin-film capacitor to not less than 70%, more preferably not less than 80%, of a maximum effective relative dielectric constant obtained upon applying the operating voltages in the positive and negative directions to the thin-film capacitor.

The control means applies an operating voltage equivalent to not less than 70% to not more than 150% of an operating voltage that maximizes an effective relative dielectric constant corresponding to a charge storage amount per applied voltage for the thin-film capacitor, in applying the operating voltages in the positive and negative directions to the thin-film capacitor.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The present inventors have made a close examination of the ferroelectric characteristics of thin ferroelectric films using the epitaxial effect. The obtained results will be described first. The capacitors used in the examination were prepared by using (001) single-crystal substrates made of strontium titanate ($SrTiO_3$; to be referred to as STO hereinafter) as substrates, and forming, by RF magnetron sputtering at a substrate temperature of 600° C., upper and lower electrodes made of SRO, and a dielectric film made of BST ($Ba_xSr_{1-x}TiO_3$) with Ba molar compositions x ranging from 0 to 1. The thickness of the BST film was set to 30 nm.

Figure 1:
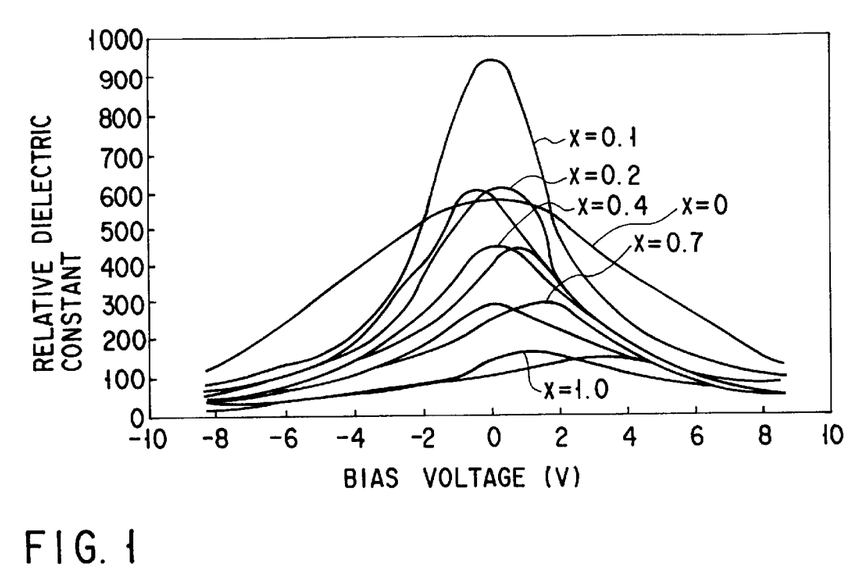
FIG. 1 is a graph showing the relative dielectric constant of ferroelectric capacitors according to the present invention.

FIG. 1 shows the dielectric constant-voltage characteristics converted from the capacitance-voltage (C-V) characteristics of the resultant samples. With a composition of x=0.1, a maximum relative dielectric constant of 980 can be obtained at a bias of 0V. This value is excellent, since it can be converted into 0.18 nm-equivalent-thickness of a silicon oxide film, which has the same capacitance as that of the sample.

Figure 2:
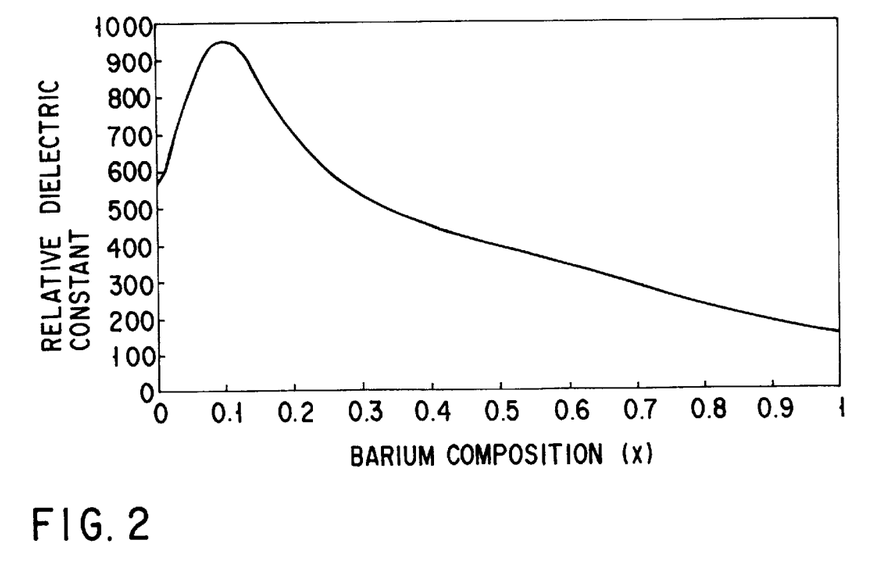
FIG. 2 is a graph showing the composition dependency of the maximum relative dielectric constant of ferroelectric capacitors according to the present invention.
Figure 3A:
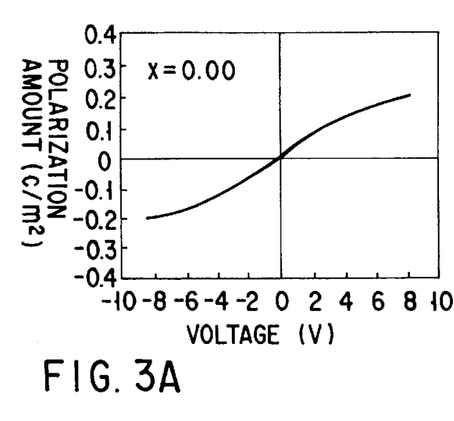
FIGS. 3A to 3F are graphs, respectively, showing the polarization amount-voltage curves of the ferroelectric capacitor according to the present invention.
Figure 3B:
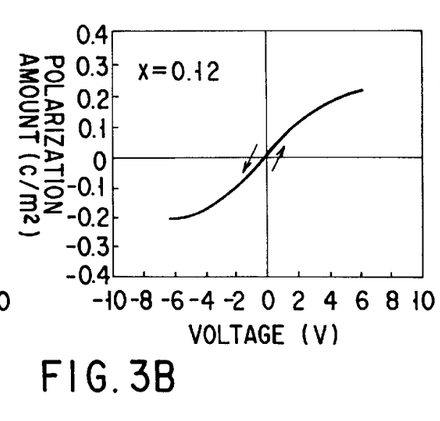
Figure 3C:
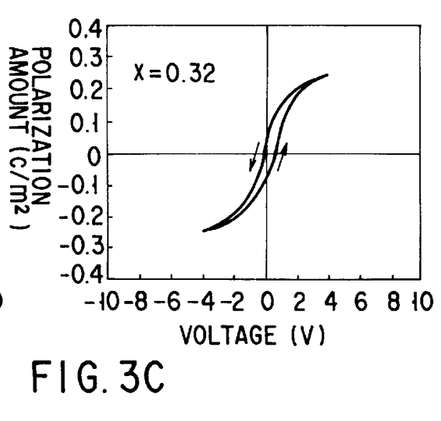
Figure 3D:
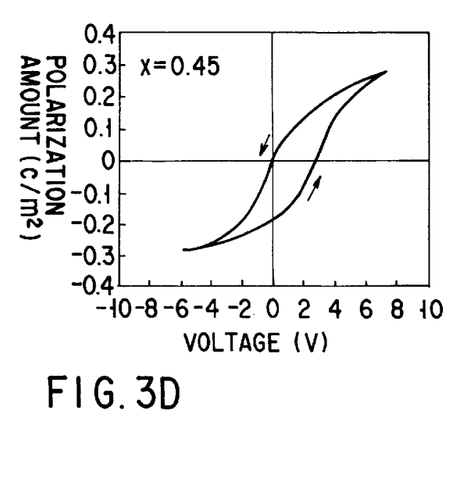
Figure 3E:
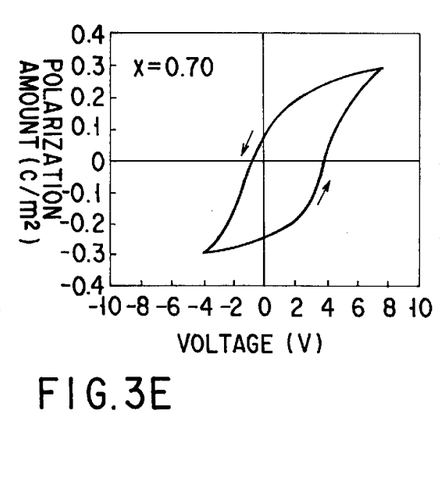
Figure 3F:
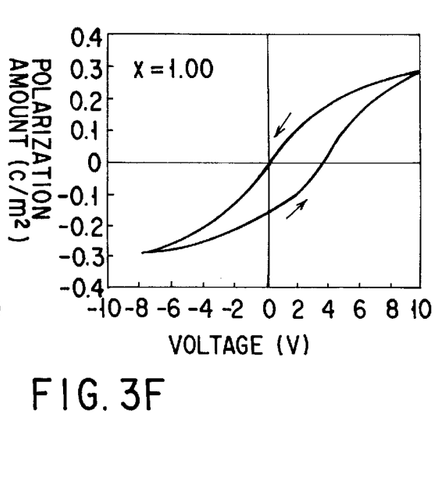

FIG. 2 shows the maximum relative dielectric constant as a function of the composition x. As x deviates from a value near 0.1, the dielectric constant abruptly decreases. It is therefore obvious that a high integration degree can be attained by fabricating a DRAM using a thin paraelectric film with a composition of near x=0.1.

FIGS. 3A to 3F show the polarization-voltage (P-V) characteristics of the resultant samples. A hysteresis indicating ferroelectricity can be observed with a composition of x=0.2 or more. In addition, the central voltage of a hysteresis shifts from 0V in the positive direction as ferroelectricity becomes prominent.

Figure 4:
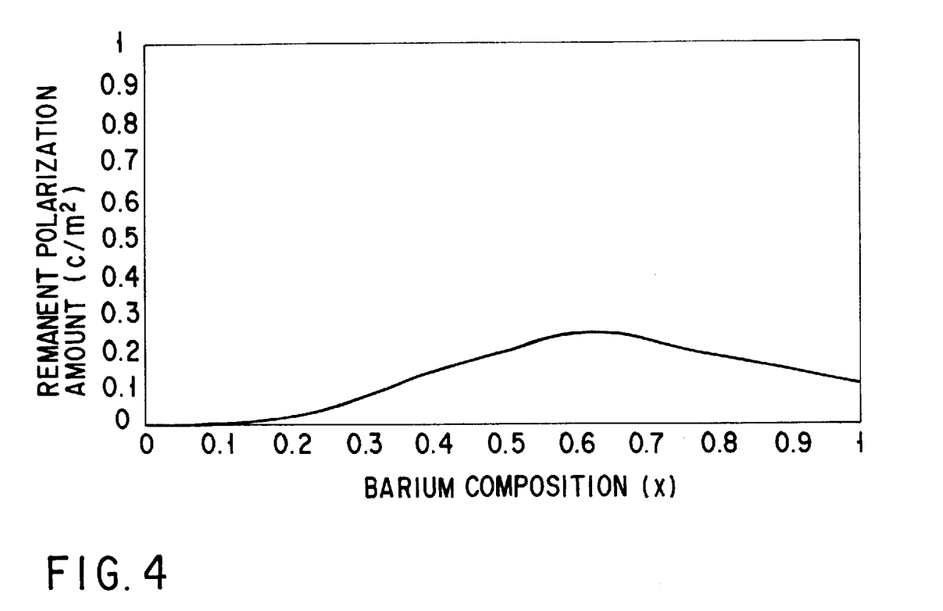
FIG. 4 is a graph showing the relationship between the remanent polarization amount and barium composition of the ferroelectric capacitor according to the present invention.

FIG. 4 shows the remanent polarization (Pr) values at the middle points of the hystereses in FIGS. 3A to 3F plotted along the composition x. As is apparent from FIG. 4, the maximum remanent polarization appears in the range of about x=0.6 to 0.8. Therefore, in using a thin ferroelectric film for FRAMs, the FRAMs can be highly integrated if the thin film has a composition of x=0.6 to 0.8.

In contrast to this conventional knowledge, the present inventors have acquired the following new findings upon reexamination of FIGS. 1 to 4. When a capacitor having a thin-film crystal with an excellent film quality which is fabricated by the epitaxial method, and a specific operating voltage range is assumed, the maximum amount of charges stored/removed in/from the capacitor in a write/read does not coincide with the composition which maximizes the dielectric constant or remanent polarization.

Figure 5A:
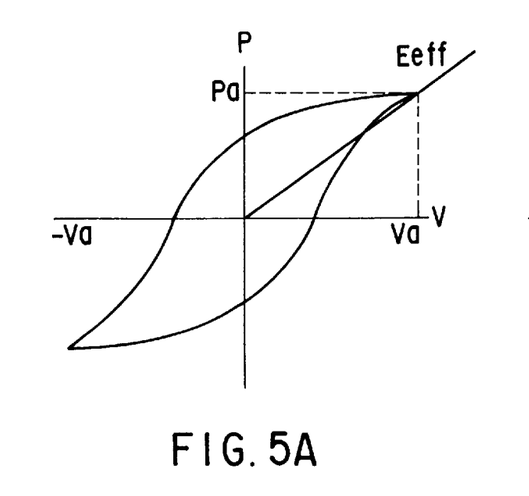
FIGS. 5A and 5B are schematic views, respectively, showing the polarization amount-voltage curves of the ferroelectric capacitor according to the present invention.
Figure 5B:
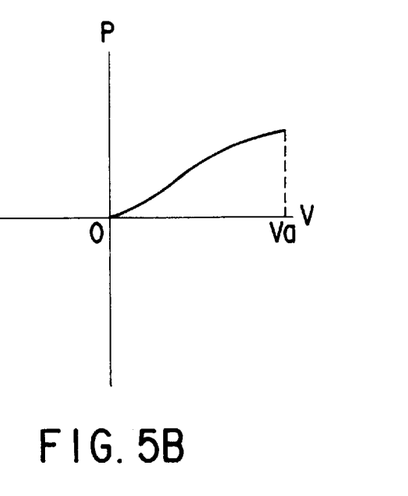

The charge storable amount of a ferroelectric film capacitor will be described below. FIGS. 5A and 5B illustrate the P-V hysteresis loops of the ferroelectric film. Conceivable methods of storing charges in the ferroelectric film include a bipolar swing method (FIG. 5A) using the two sides of the hysteresis loop with respect to the central voltage, and a unipolar swing method (FIG. 5B) using only one side of the hysteresis with respect to the central voltage. In the unipolar swing method, since only the paraelectric component is used without forming any hysteresis loop, the charge storage amount is small. In the bipolar swing method, since the ferroelectric component can also be used, the charge storage amount is large, but the ferroelectric component greatly depends on the amplitude.

Figure 6:
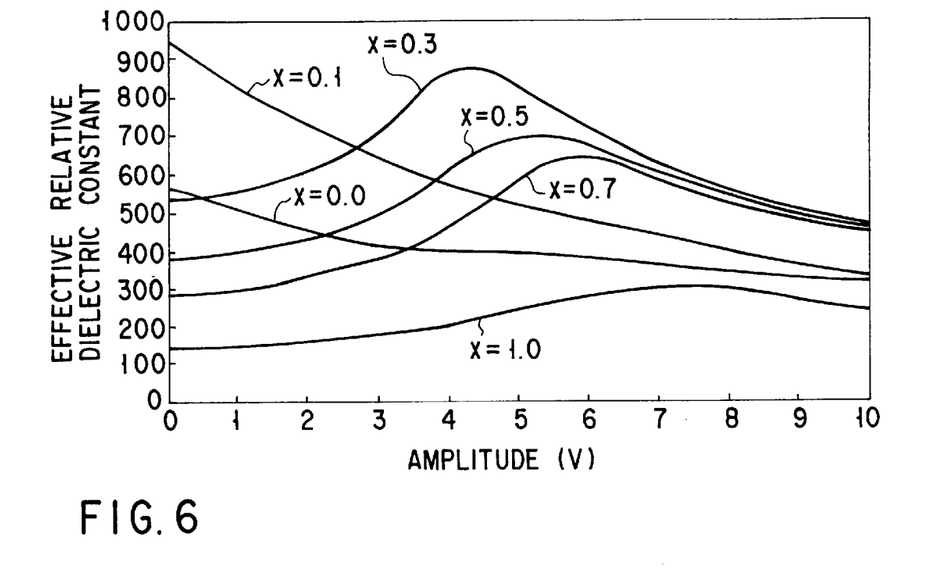
FIG. 6 is a graph showing the relationship between the effective relative dielectric constant and amplitude of the ferroelectric capacitor according to the present invention.

Let Pa/Va be the effective relative dielectric constant corresponding to the charge storage amount per voltage when a polarization amount Pa is obtained by the bipolar swing method upon application of an amplitude Va. FIG. 6 shows the effective relative dielectric constants of respective dielectric capacitors which are measured by the bipolar swing method while the voltage amplitudes are changed from the middle points of the hysteresis loops.

As is obvious from FIG. 6, in a small voltage amplitude region, the dielectric film with a composition of x=0.1, which allows the maximum relative dielectric constant, has the maximum effective relative dielectric constant. In contrast to this, the dielectric films with a composition of x=0.3 or more, which have high ferroelectricity, have peak effective relative dielectric constants at specific voltage amplitudes. In addition, of these films, the dielectric film with a composition of x=0.3 has the maximum value except in the small voltage amplitude region. That is, the composition range of x=0.6 to 0.8 in which high ferroelectricity can be obtained is not necessarily advantageous in terms of the effective relative dielectric constant. In this range, the voltage at which a peak value is obtained increases, which is undesirable in terms of the device operation. Considering total stored charges without differentiating charges based on paraelectricity from charges based on ferroelectricity, the present inventors have found that a large effective relative dielectric constant could be obtained at a low operating voltage in a composition range in which weak ferroelectricity is obtained.

Figure 7:
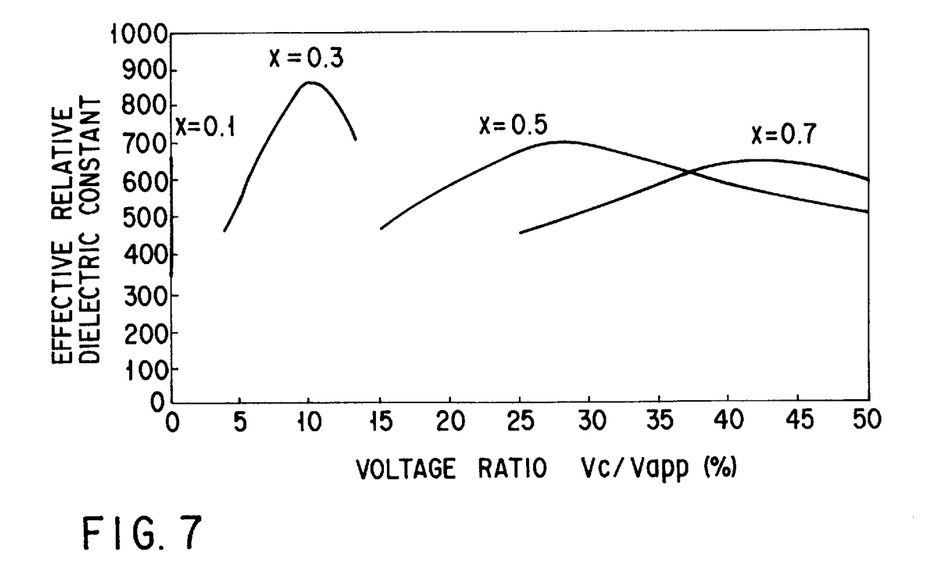
FIG. 7 is a graph showing the relationship between the effective relative dielectric constant and voltage ratio of the ferroelectric capacitor according to the present invention.

To index a desired degree of ferroelectricity, the present inventors have calculated the ratios of the coercive voltages of the dielectric films with the respective compositions, which correspond to the halves of the widths of hysteresis curves obtained upon application of operating voltages of different magnitudes, to the operating voltages, and checked the relationships between the ratios and the effective relative dielectric constants. FIG. 7 shows the relationships. As is apparent from FIG. 7, large effective relative dielectric constants can be obtained at voltage ratios of about 5% to 20%. Therefore, a voltage corresponding to the width of a polarization hysteresis curve measured upon application of maximum operating voltages in the positive and negative directions to a thin-film capacitor preferably falls within the range of 5% or higher to 20% or lower of the difference between the maximum operating voltages in the positive and negative directions.

Figure 8:
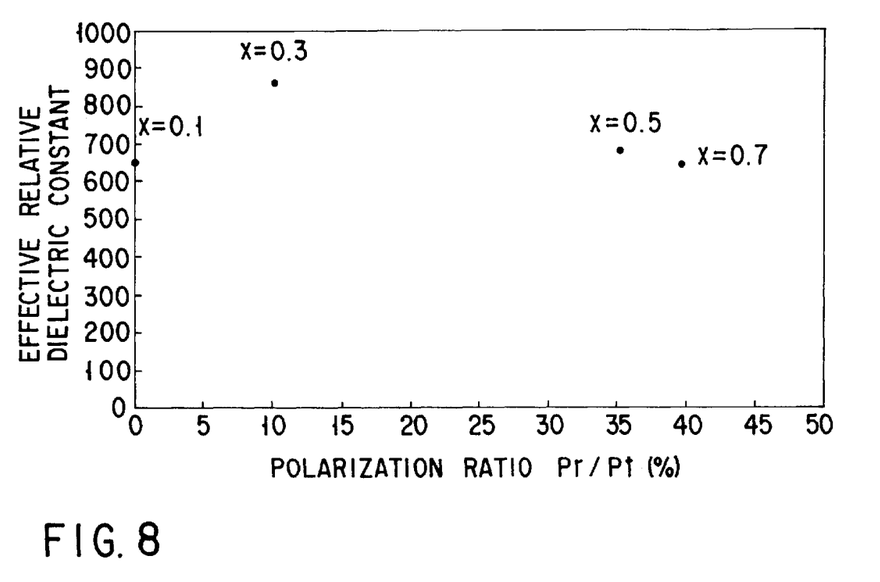
FIG. 8 is a graph showing the relationship between the effective relative dielectric constant and polarization ratio of the ferroelectric capacitor according to the present invention.

Similarly, to index a desired degree of ferroelectricity by another method, the present inventors obtained the ratios of the remanent polarization amounts at the middle points of hysteresis curves obtained when operating voltages of different magnitudes were applied to the dielectric films with the respective compositions, to the total polarization amounts at the operating voltages, and checked the relationships between the ratios and the effective relative dielectric constants. FIG. 8 shows the relationships. As is apparent from FIG. 8, large effective relative dielectric constants can be obtained at polarization ratios of about 5% to 30%.

Therefore, the remanent polarization amount measured upon application of maximum operating voltages in the positive and negative directions to a thin-film capacitor preferably falls within the range of 5% or higher to 30% or lower of the total polarization amount measured upon application of the maximum operating voltages in the positive and negative directions.

Table 1 shows the relationship between the Ba molar composition x of each BST ($Ba_xSr_{1-x}TiO_3$) film and the lattice constant (c-axis length) of the BST film in the thickness direction (c-axis). As shown in Table 1, c-axis lengths corresponding to compositions of x=about 0.3 to 0.5 which provide desired ferroelectricity in the present invention are about 0.405 to 0.420 nm. The c-axis length is the most fundamental value for determining the displaceable distance of titanium ions that yield ferroelectricity in a perovskite crystal, i.e., a polarization amount. In the present invention, therefore, a BST-based epitaxial dielectric film preferably has a c-axis length of about 0.405 to 0.420 nm.

TABLE 1

| Composition x | c-Axis Length (nm) |
|---|---|
| 0 | 0.395 |
| 0.1 | 0.399 |
| 0.3 | 0.407 |
| 0.5 | 0.417 |
| 0.7 | 0.424 |
| 1.0 | 0.423 |

The composition dependency of the relative dielectric constant of a polycrystalline BST dielectric film as a comparative example fabricated by a general method will be described next. Capacitors used for the examination were obtained by using Si wafers as substrates on which oxide films were formed in advance, forming Pt films as upper and lower electrodes by RF magnetron sputtering at room temperature, and forming BST ($Ba_xSr_{1-x}TiO_3$) films with Ba molar compositions x ranging from 0 to 1 as dielectric films by RF magnetron sputtering at a substrate temperature 600° C. The thickness of each BST film was set to 30 nm, which was equal to that of an epi-dielectric film.

Figure 9:
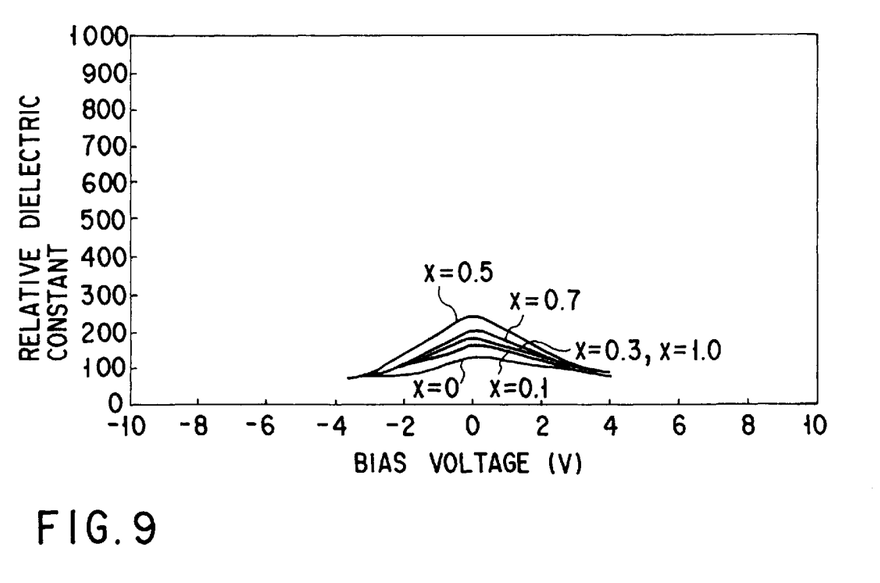
FIG. 9 is a graph showing the relative dielectric constant of the ferroelectric capacitor of a comparative example.

FIG. 9 shows the dielectric constant-voltage characteristics converted from the capacitance-voltage (C-V) characteristics of the resultant polycrystalline dielectric samples. A polycrystalline BST film which is not constrained by a crystal strain from the lower electrode exhibits a maximum relative dielectric constant of 230 with a composition of about x=0.5. If, however, a polycrystalline sample is as thin as 30 nm, almost no ferroelectric hysteresis loop is formed in P-V measurement, and any remanent polarization cannot be obtained even with a barium composition higher than a composition of x=0.5 which maximizes the dielectric constant. This film greatly differs in this point from an epitaxial BST film. Therefore, the effective relative dielectric constant obtained by P-V measurement is almost equal to that calculated from the relative dielectric constant obtained by C-V measurement, and the method of increasing the charge storage amount using such weak ferroelectricity cannot be applied to the present invention.

In an FRAM using a ferroelectric film, it is required that polarization based on ferroelectricity is satisfactorily used, the operating voltage for the device is minimized, and the operating voltage is decreased to suppress a deterioration due to fatigue. To meet these requirements, the FRAM must have a coercive voltage at least 30% of the operating voltage, preferably 40% or higher. This range clearly differs from the target range based on the findings of the present invention.

Some FRAMs using capacitor materials such as PZT are designed to selectively use an FRAM operation and a DRAM operation so as to suppress a deterioration due to fatigue. In the DRAM operation, a low operating voltage range (to be referred to as a minor loop) in which no polarization saturation occurs, and apparently weak ferroelectricity may be used. The concept of this operation seems to be similar to that of the present invention. Also in this case, however, in the FRAM operation requiring nonvolatile characteristics, a voltage which is higher than that used in the DRAM operation and allows the use of ferroelectricity is applied. For this reason, this FRAM is the same as a general conventional FRAM in terms of the maximum operating voltage range for the capacitors. Accordingly, this method is completely different from the method of the present invention in which operating voltages in a predetermined range including the maximum effective relative dielectric constant are used to maximize the polarization amount of the dielectric substance.

Some attempts have been made to use ferroelectric materials such as PZT as materials for DRAMs. In this case, to prevent a deterioration due to fatigue, the unipolar swing method shown in FIG. 5B is used, and only the paraelectric component of the polarization of a ferroelectric substance is used. This method is therefore completely different from the method of the present invention in which the polarization amount of a dielectric substance is maximized.

In the present invention, the ferroelectricity may deteriorate due to repetitive writes/reads because the ferroelectricity is partially used. However, the present inventors have confirmed by the experiment that no deterioration occurs about $10^{12}$ times of writes/reads because the ferroelectricity in the present invention is weak.

As described above, a ferroelectric film used in a semiconductor memory device according to the present invention is preferably formed on an underlayer surface, i.e., the upper surface of a lower electrode, by epitaxial growth using a dielectric material having a lattice constant relatively near and slightly larger than the lattice constant of the lower electrode. The lattice constant of the crystal of the ferroelectric film increases in the film thickness direction (c-axis), but the lattice constant (a-axis) decreases in the planar direction. As a result, the Curie temperature of the ferroelectric film can be increased to allow large remanent polarization to be held in a room-temperature region. The same effect as that described above can also be obtained when a ferroelectric film is grown as a polycrystal to have a surface facing an upper electrode and oriented in the same direction, instead of a single crystal.

A material for a ferroelectric film having a perovskite crystal structure can be given by a composition expression of $Ba_x\alpha_{1-x}Ti_y\beta_{1-y}O_3$ ($0<x\leq1$, $0<y\leq1$), where $\alpha$ is one or a plurality of materials selected from the group consisting of Sr and Ca, and $\beta$ is one or a plurality of materials selected from the group consisting of Sn, Zr, Hf, Mg, Ta, Nb, and Zn. For example, the material $\beta$ also includes alloys such as $Mg_{1/3}Ta_{2/3}$, $Mg_{1/3}Nb_{2/3}$, $Zn_{1/3}Nb_{2/3}$, and $Zn_{1/3}Ta_{2/3}$.

A material which can be used for an electrode serving as an underlayer surface is a conductive oxide having a perovskite crystal structure such as strontium ruthenate or strontium molybdate, a noble metal such as platinum, gold, palladium, iridium, rhodium, rhenium, or ruthenium, one of alloys thereof, or one of oxides thereof.

[EXAMPLE 1]

FIGS. 10A to 10F are schematic sectional views sequentially showing the steps in a method of manufacturing a semiconductor memory device according to Example 1 of the present invention. As a ferroelectric capacitor, a strain induction ferroelectric film using a misfit strain caused during epitaxial growth was used. In FIGS. 10A to 10F, reference numeral 1 denotes a semiconductor substrate of the first conductivity type; 2, an element isolation oxide film; 3, a gate oxide film; 4, a word line; 5 and 7, interlevel insulating films; 6, an impurity diffusion layer of the second conductivity type; 8, a bit line; 11, a single-crystal silicon contact plug; 12, a barrier metal; 13, a lower electrode; 14, a ferroelectric film; and 15, an upper electrode.

Figure 10A:
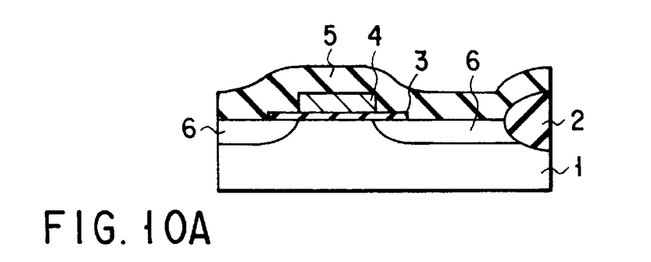
FIGS. 10A to 10F are sectional views sequentially showing the steps in a method of manufacturing a RAM device according to an embodiment of the present invention.

As shown in FIG. 10A, the transistor portion and the interlevel insulating film 5 of a known memory cell were formed by a general manufacturing method.

Figure 10B:
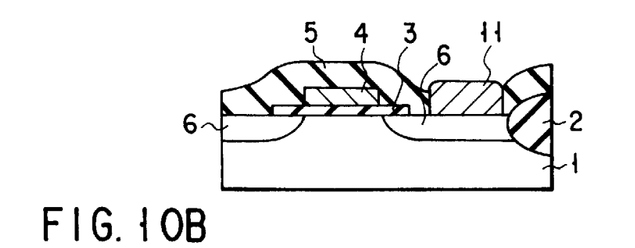

As shown in FIG. 10B, a contact hole was formed in the interlevel insulating film 5. In forming the contact hole, the insulating film was etched first to a depth corresponding to about 80% of its film thickness by reactive ion etching (RIE), and the insulating film was then etched to the surface of the silicon substrate by an aqueous hydrofluoric acid solution to expose a (100) plane of the silicon substrate. The contact plug 11 was formed by silicon selective growth CVD. In forming the contact plug, a silicon substrate was selectively buried to grow the single-crystal silicon contact plug 11 on the (100) plane of the silicon substrate in the contact hole in a <100> direction at a growth temperature of 820° C. by LPCVD using dichlorosilane as a source gas.

Figure 10C:
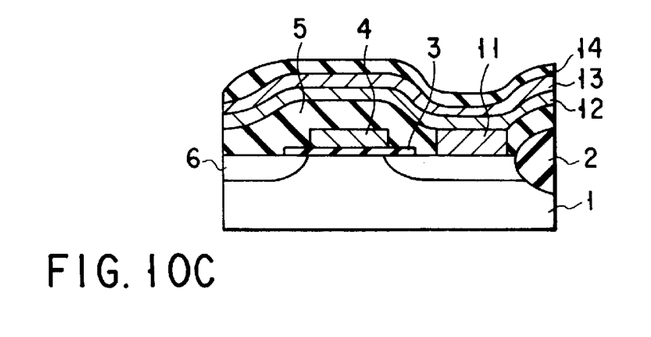

As shown in FIG. 10C, the contact plug 11 was etched back to be planarized by wet selective etching using hydrofluoric acid. Thereafter, a TiN film was formed as the barrier metal 12 at 600° C. by reactive sputtering, a thin strontium ruthenate film was formed as the lower electrode 13 by sputtering, and the thin BST film 14 having a thickness of 30 nm was formed at 600° C. by sputtering. All these films were epitaxially grown in the <100> direction. In this case, the molar comnposition x of Ba contained in the BST film was changed from 0 to 1.

Figure 10D:
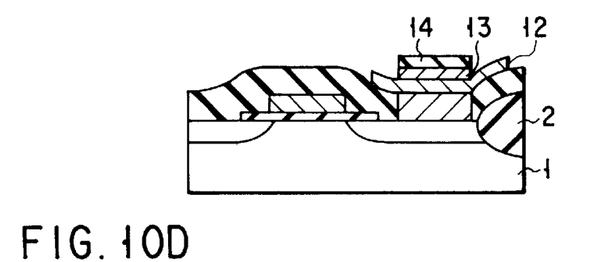
Figure 10E:
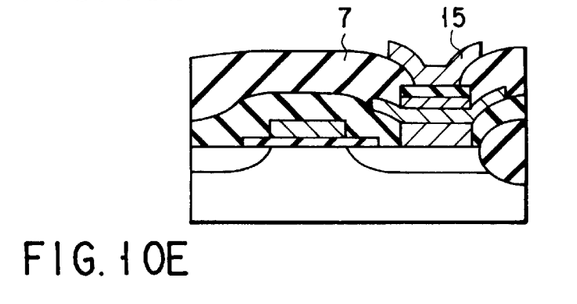
Figure 10F:
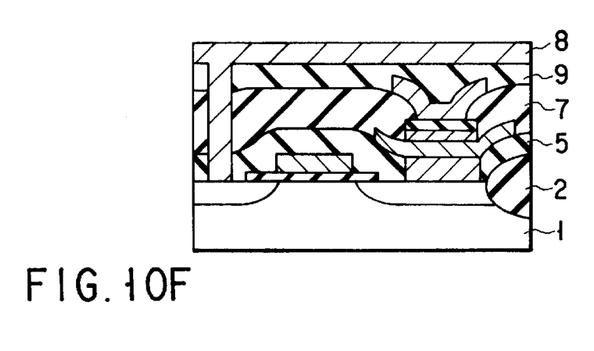

As shown in FIG. 10D, the dielectric layer, the lower electrode layer, and the barrier metal layer were patterned by photolithography and ion etching. As shown in FIG. 10E, the interlevel insulating film 7 was deposited, and a hole was formed in the interlevel insulating film by photolithography and ion etching. The nickel upper electrode 15 was formed in the hole. Thereafter, as shown in FIG. 10F, a hole was formed in the interlevel insulating film by photolithography and ion etching, and the bit line 8 was formed in the hole.

The polarization amount-voltage hysteresis characteristics of the thin dielectric capacitors of the active cells formed in this manner were measured to obtain the results shown in FIGS. 3A to 3F. The ferroelectric capacitors were supplied first with voltages on the positive voltage side and then with voltages on the negative voltage side, the voltages being applied in different amplitudes by bipolar swing with respect to the middle point of the hysteresis, and then effective relative dielectric constants were calculated from charges stored in the ferroelectric capacitors to obtain the results shown in FIG. 6.

A very large effective relative dielectric constant of 860 was obtained from the dielectric capacitor using the BST film with a barium composition of 0.3 at an amplitude of 4V. That is, this capacitor exhibited very high charge storage ability. In addition, no decrease in effective relative dielectric constant was not recognized after $10^{12}$ switching cycles.

It was confirmed from the above measurement results that this capacitor functioned with sufficient stability as a ferroelectric capacitor for a nonvolatile semiconductor memory device. That is, according to the present invention, the maximum effective relative dielectric constant can be used with weak ferroelectricity induced by a strain caused in the process of epitaxial growth, and hence a semiconductor memory device with a very high degree of integration can be manufactured.

Figure 11:
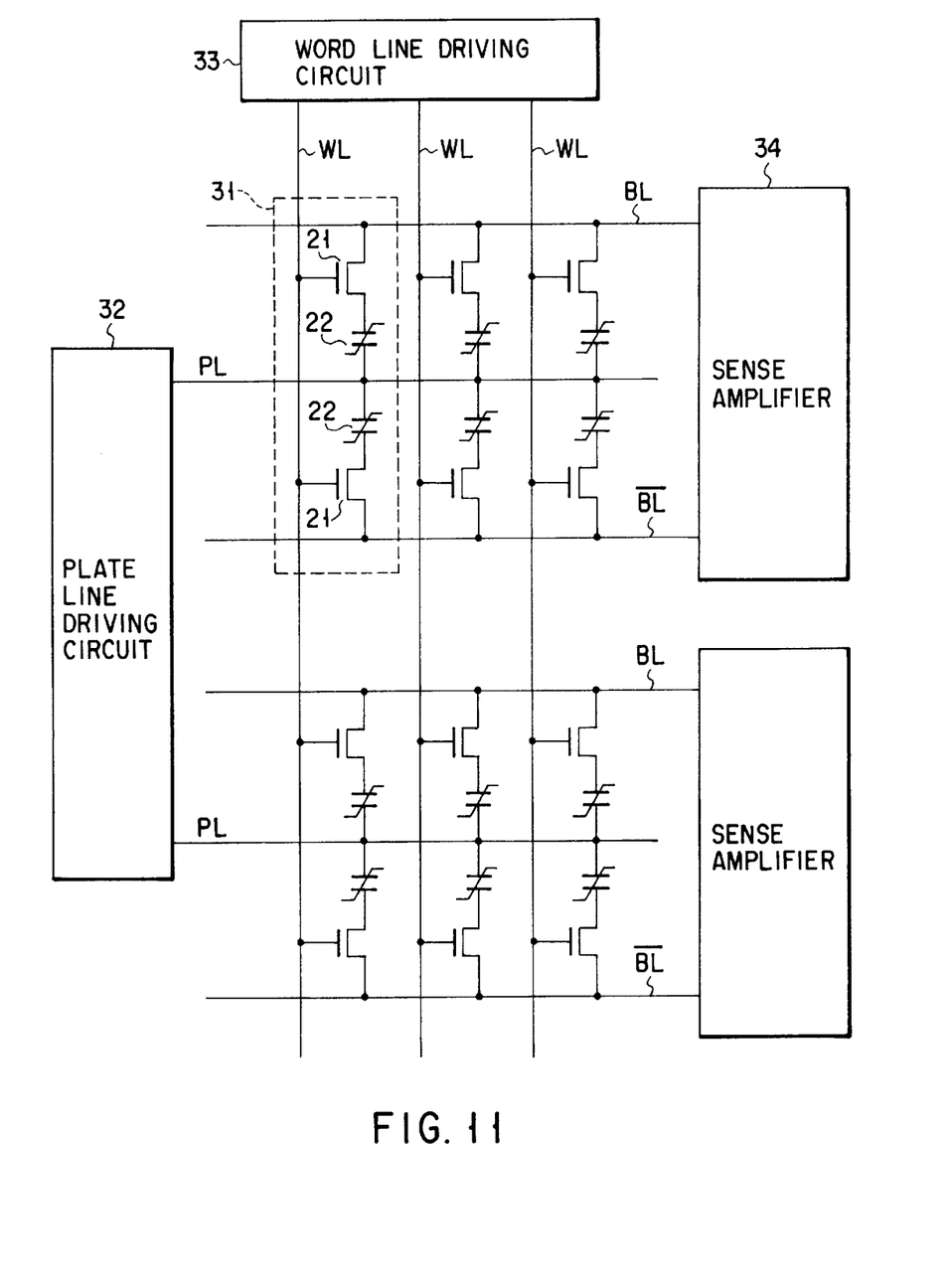
FIG. 11 is a circuit diagram showing a RAM device according to another embodiment of the present invention.
Figure 12:
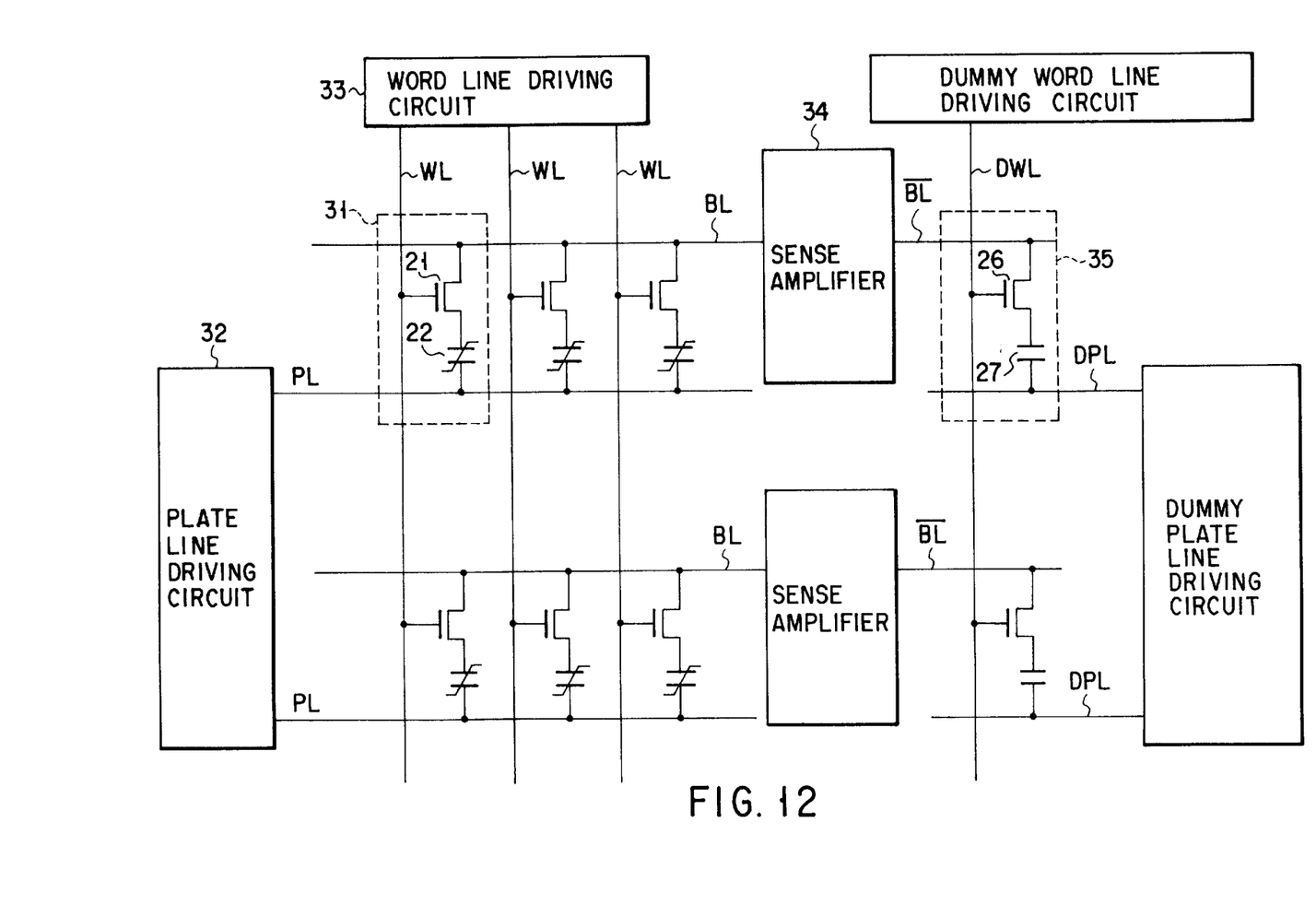
FIG. 12 is a circuit diagram showing a RAM device according to still another embodiment of the present invention.

FIGS. 11 and 12 are circuit diagrams, respectively, showing RAM devices each using the above ferroelectric capacitor according to different embodiments of the present invention.

In the RAM device of FIG. 11, one memory cell includes two transistors 21 and two capacitors 22. That is, a unit cell is constituted by one MOS transistor 21 and one capacitor 22 using a ferroelectric film, and one memory cell 31 is constituted by two unit cells adjacent in the word line WL direction.

Information is written in this nonvolatile semiconductor memory in the following manner. A word line WL corresponding to a predetermined row address is selected by a word line driving circuit 33, and the selected line is activated to turn on the corresponding switching transistors 21. In this state, complementary potentials (e.g., 5V and 0V) corresponding to information "1" or "0" are applied to a pair of bit lines BL and /BL. At the same time, a plate line PL is activated by a plate line driving circuit 32 to transfer a write signal. With this operation, the ferroelectric capacitors 22 of the two unit cells in one memory cell 21 are polarized in the opposite directions.

Subsequently, the word line WL is inactivated to turn off the switching transistors 21. As a result, the information "1" or "0" is stored/held in the memory cell 31 selected by the AND of the above row and column addresses, thereby writing the information. After this, even if one of the word line and the plate line/bit line coupled to the memory cell 31 in which the information was written is activated, the written information is not lost.

In reading information, a word line WL corresponding to a predetermined row address is selected by the word line driving circuit 33, and the selected line is activated to turn on the corresponding switching transistors 21. Thereafter, a pair of bit lines BL and /BL corresponding to a predetermined column address are precharged to be set in a floating state. The corresponding plate line PL is activated by the plate line driving circuit 32 to apply a predetermined potential.

With this operation, the pieces of information stored/held in the two capacitors 22 polarized in the opposite directions in the memory cell 31 selected by the AND of the row and column addresses are extracted to the pair of precharged bit lines BL and /BL through the switching transistors 21. As a result, a slight potential difference based on a charge amount difference corresponding to the difference between the ferroelectric polarization in the inverting direction and that in the non-inverting direction is formed between the pair of bit lines BL and /BL. This potential difference is amplified by a sense amplifier 34 to read out the information. In a subsequent predetermined operation, the pieces of information stored before the above read are written in the capacitors 22 in the memory cell 31, thereby rewriting the pieces of information.

In the RAM device shown in FIG. 11, the two adjacent capacitors 22 are polarized in the opposite directions in advance, and a read is performed by polarizing them in one direction and detecting the difference between the charge storage amounts. This operation is resistant to the influences of variations in charges stored in the capacitors 22 and a deterioration due to fatigue.

In the RAM device of FIG. 12, one memory cell 31 is constituted by one MOS transistor 21 and one capacitor 22 using a thin ferroelectric film. To apply a reference potential to a pair of bit lines BL and /BL, a dummy cell 35 made up of one transistor 26 and one thin-film capacitor 27 is additionally arranged in this device.

In this RAM device, the polarization direction of one thin-ferroelectric-film capacitor 22 of the memory cell 31 represents stored information. In reading information, a voltage is applied to plate lines PL and DPL of the memory cell 31 and the dummy cell 35. The sense amplifier 34 compares the charge amount of the capacitor 22 of the memory cell 31 with that of the capacitor 27 of the dummy cell 35 to determine the comparison result. This arrangement is therefore suited to a large-capacity memory device, compared to an arrangement using two transistors and two capacitors like the RAM device shown in FIG. 11. On the other hand, since this device uses only ½ or less of the charge amount of the device in FIG. 11 to perform comparison, it requires a highly reliable ferroelectric film, such as a BST-based ferroelectric film employed in the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A thin-film capacitor device using a ferroelectric film, comprising:
   a thin-film capacitor having a ferroelectric film and a pair of electrodes facing each other via said ferroelectric film; and
   control means for applying an operating voltage to said thin-film capacitor,
   wherein a voltage corresponding to a width of a polarization hysteresis curve measured upon application of maximum operating voltages in positive and negative directions to said thin-film capacitor falls within a range of not less than 5% to not more than 20% of a difference between the maximum operating voltages in the positive and negative directions.

2. The device according to claim 1, wherein one of said pair of electrodes provides an underlayer surface oriented in one direction, and said ferroelectric film is made of a single-crystal grown on said underlayer surface, or a polycrystal grown on said underlayer surface to be oriented in one direction between said pair of electrodes.

3. The device according to claim 2, wherein said underlayer surface has a lattice constant smaller than a lattice constant of a material of said ferroelectric film, and the crystal of said ferroelectric film deforms under an influence of said underlayer surface to decrease a lattice constant in a direction parallel to said underlayer surface and increase the lattice constant in a film thickness direction.

4. The device according to claim 3, wherein the material of said ferroelectric film is given by a composition expression of $Ba_x\alpha_{1-x}Ti_y\beta_{1-y}O_3$ (0<x≦1, 0<y≦1), where α is at least one material selected from the group consisting of Sr and Ca, and β is at least one material selected from the group consisting of Sn, Zr, Hf, Mg, Ta, Nb, and Zn.

5. The device according to claim 4, wherein a lattice constant of the crystal of said ferroelectric film in a c-axis direction extending in the film thickness direction is 0.405 to 0.420 nm.

6. The device according to claim 1, wherein said control means applies the operating voltage to set an effective relative dielectric constant corresponding to a charge storage amount per applied voltage for said thin-film capacitor to not less than 70% of a maximum effective relative dielectric constant obtained upon applying the operating voltages in the positive and negative directions to said thin-film capacitor.

7. The device according to claim 1, wherein said control means applies an operating voltage equivalent to not less than 70% to not more than 150% of an operating voltage that maximizes an effective relative dielectric constant corresponding to a charge storage amount per applied voltage for said thin-film capacitor, in applying the operating voltages in the positive and negative directions to said thin-film capacitor.

8. A thin-film capacitor device using a ferroelectric film, comprising:
   a thin-film capacitor having a ferroelectric film and a pair of electrodes facing each other via said ferroelectric film; and
   control means for applying an operating voltage to said thin-film capacitor,
   wherein a remanent polarization amount measured upon application of maximum operating voltages in positive and negative directions to said thin-film capacitor falls within a range of not less than 5% to not more than 30% of a total polarization amount measured upon application of the maximum operating voltages in the positive and negative directions.

9. The device according to claim 8, wherein one of said pair of electrodes provides an underlayer surface oriented in one direction, and said ferroelectric film is made of a single-crystal grown on said underlayer surface, or a polycrystal grown on said underlayer surface to be oriented in one direction between said pair of electrodes.

10. The device according to claim 9, wherein said underlayer surface has a lattice constant smaller than a lattice constant of a material of said ferroelectric film, and the crystal of said ferroelectric film deforms under an influence of said underlayer surface to decrease a lattice constant in a direction parallel to said underlayer surface and increase the lattice constant in a film thickness direction.

11. The device according to claim 10, wherein the material of said ferroelectric film is given by a composition expression of $Ba_x\alpha_{1-x}Ti_y\beta_{1-y}O_3$ (0<x≦1, 0<y≦1), where α is at least one material selected from the group consisting of Sr and Ca, and β is at least one material selected from the group consisting of Sn, Zr, Hf, Mg, Ta, Nb, and Zn.

12. The device according to claim 11, wherein a lattice constant of the crystal of said ferroelectric film in a c-axis direction extending in the film thickness direction is 0.405 to 0.420 nm.

13. The device according to claim 8, wherein said control means applies the operating voltage to set an effective relative dielectric constant corresponding to a charge storage amount per applied voltage for said thin-film capacitor to not less than 70% of a maximum effective relative dielectric constant obtained upon applying the operating voltages in the positive and negative directions to said thin-film capacitor.

14. The device according to claim 8, wherein said control means applies an operating voltage equivalent to not less than 70% to not more than 150% of an operating voltage that maximizes an effective relative dielectric constant corresponding to a charge storage amount per applied voltage for said thin-film capacitor, in applying the operating voltages in the positive and negative directions to said thin-film capacitor.

15. A RAM device using a ferroelectric film, comprising:

a plurality of memory cells arranged in a matrix format, each memory cell having a thin-film capacitor having a ferroelectric film and a pair of electrodes facing each other via said ferroelectric film, and a transfer gate transistor connected to said thin-film capacitor; and control means for driving said transistor and applying an operating voltage to said thin-film capacitor, wherein a voltage corresponding to a width of a polarization hysteresis curve measured upon application of maximum operating voltages in positive and negative directions to said thin-film capacitor falls within a range of not less than 5% to not more than 20% of a difference between the maximum operating voltages in the positive and negative directions.

16. The device according to claim 15, wherein said control means applies the operating voltage to set an effective relative dielectric constant corresponding to a charge storage amount per applied voltage for said thin-film capacitor to not less than 70% of a maximum effective relative dielectric constant obtained upon applying the operating voltages in the positive and negative directions to said thin-film capacitor.

17. The device according to claim 15, wherein said control means applies an operating voltage equivalent to not less than 70% to not more than 150% of an operating voltage that maximizes an effective relative dielectric constant corresponding to a charge storage amount per applied voltage for said thin-film capacitor, in applying the operating voltages in the positive and negative directions to said thin-film capacitor.

18. A RAM device using a ferroelectric film, comprising:

a plurality of memory cells arranged in a matrix format, each memory cell having a thin-film capacitor having a ferroelectric film and a pair of electrodes facing each other via said ferroelectric film, and a transfer gate transistor connected to said thin-film capacitor; and control means for driving said transistor and applying an operating voltage to said thin-film capacitor, wherein a remanent polarization amount measured upon application of maximum operating voltages in positive and negative directions to said thin-film capacitor falls within a range of not less than 5% to not more than 30% of a total polarization amount measured upon application of the maximum operating voltages in the positive and negative directions.

19. The device according to claim 18, wherein said control means applies the operating voltage to set an effective relative dielectric constant corresponding to a charge storage amount per applied voltage for said thin-film capacitor to not less than 70% of a maximum effective relative dielectric constant obtained upon applying the operating voltages in the positive and negative directions to said thin-film capacitor.

20. The device according to claim 18, wherein said control means applies an operating voltage equivalent to not less than 70% to not more than 150% of an operating voltage that maximizes an effective relative dielectric constant corresponding to a charge storage amount per applied voltage for said thin-film capacitor, in applying the operating voltages in the positive and negative directions to said thin-film capacitor.

* * * * *